United States Patent
Yang et al.

(10) Patent No.: US 11,486,947 B2
(45) Date of Patent: Nov. 1, 2022

(54) MULTI-ROW ARRAY RF COIL WITH MINIMIZED COUPLINGS USING BIRDCAGE COILS

(71) Applicant: Quality Electrodynamics, LLC, Mayfield Village, OH (US)

(72) Inventors: Xiaoyu Yang, Indiana, PA (US); Mathew Finnerty, University Heights, OH (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 36 days.

(21) Appl. No.: 17/202,864

(22) Filed: Mar. 16, 2021

(65) Prior Publication Data

US 2021/0318398 A1 Oct. 14, 2021

Related U.S. Application Data

(60) Provisional application No. 63/009,002, filed on Apr. 13, 2020.

(51) Int. Cl.
*G01R 33/34* (2006.01)
*G01R 33/36* (2006.01)

(52) U.S. Cl.
CPC ..... *G01R 33/34076* (2013.01); *G01R 33/365* (2013.01); *G01R 33/3635* (2013.01)

(58) Field of Classification Search
CPC .......... G01R 33/34076; G01R 33/3635; G01R 33/365
See application file for complete search history.

(56) References Cited

U.S. PATENT DOCUMENTS

| 4,825,162 A | 4/1989 | Roemer et al. |
| 5,666,055 A * | 9/1997 | Jones ................. G01R 33/3664 |
| | | 324/318 |
| 7,091,721 B2 | 8/2006 | Jevtic |
| 11,204,402 B2 * | 12/2021 | Yang ................. G01R 33/3635 |

(Continued)

OTHER PUBLICATIONS

Yang, Jianmin "A Novel Method to Reduce the Signal Coupling of Surface Coils for MRI" Proc. ISMRM 4:1434 (1996), published in 1996.

(Continued)

*Primary Examiner* — Dixomara Vargas
(74) *Attorney, Agent, or Firm* — Eschweiler & Potashnik, LLC

(57) ABSTRACT

Various embodiments of the present disclosure are directed towards a magnetic resonance imaging (MRI) radio frequency (RF) coil array configured to operate in at least one of a transmit mode or a receive mode on a cylindrical former. The MRI RF coil array includes at first row of RF coil elements. Each row of RF coil elements includes at least three RF coil elements that circumferentially surround a cylindrical axis. The MRI RF coil array also includes a first birdcage coil that circumferentially surrounds the first row of RF coil elements. Each RF coil element of the first row is configured to inductively couple to the first birdcage coil and to each other RF coil elements. The first birdcage coil has an impedance configured to negate inductive coupling between the RF coil elements of the first row.

20 Claims, 9 Drawing Sheets

(56) References Cited

U.S. PATENT DOCUMENTS

| | | | | |
|---|---|---|---|---|
| 2005/0062472 A1* | 3/2005 | Bottomley | ....... | G01R 33/34046 324/318 |
| 2007/0285199 A1* | 12/2007 | Okamoto | ........... | G01R 33/3415 335/296 |
| 2012/0062232 A1* | 3/2012 | Matschl | ............... | G01R 33/422 324/318 |
| 2018/0081005 A1* | 3/2018 | Yang | ................. | G01R 33/3614 |
| 2018/0180690 A1* | 6/2018 | Otake | .................... | A61B 5/055 |
| 2018/0275234 A1* | 9/2018 | Han | .................... | A61B 5/4585 |
| 2019/0187227 A1* | 6/2019 | Yang | ................. | G01R 33/3628 |
| 2019/0257898 A1* | 8/2019 | Yang | ................. | G01R 33/3664 |
| 2019/0331744 A1* | 10/2019 | Yang | ................. | G01R 33/385 |
| 2019/0331745 A1* | 10/2019 | Chen | ................. | G01R 33/3628 |
| 2020/0271739 A1* | 8/2020 | Zhu | .................... | G01R 33/3664 |
| 2020/0278405 A1* | 9/2020 | Yang | ................. | G01R 33/3415 |
| 2020/0292642 A1* | 9/2020 | Yang | ................. | G01R 33/3415 |
| 2020/0292643 A1* | 9/2020 | Yang | ................... | G01R 33/365 |
| 2021/0247476 A1* | 8/2021 | Yang | ................. | G01R 33/3628 |
| 2022/0120831 A1* | 4/2022 | Yang | ................ | G01R 33/34084 |

OTHER PUBLICATIONS

"Questions and Answers in MRI—Birdcage Coils" The date of publication is unknown Retrieved online on Feb. 10, 2021 from http://mriquestions.com/birdcage-coil.html.

* cited by examiner

MULTI-ROW ARRAY RF COIL WITH MINIMIZED COUPLINGS USING BIRDCAGE COILS

REFERENCE TO RELATED APPLICATION

This application claims the benefit of U.S. Provisional Application No. 63/009,002, filed on Apr. 13, 2020, the contents of which are incorporated by reference in their entirety.

BACKGROUND

Magnetic resonance imaging (MRI) involves the transmission and receipt of radio frequency (RF) energy. RF energy may be transmitted by an RF coil to create a $B_1$ field that rotates a net magnetization. Further, resulting magnetic resonance (MR) signals may be received by an RF coil to detect precessing transverse magnetization. Thus, RF coils may be transmit (Tx) coils, receive (Rx) coils, or transmit and receive (Tx/Rx) coils.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
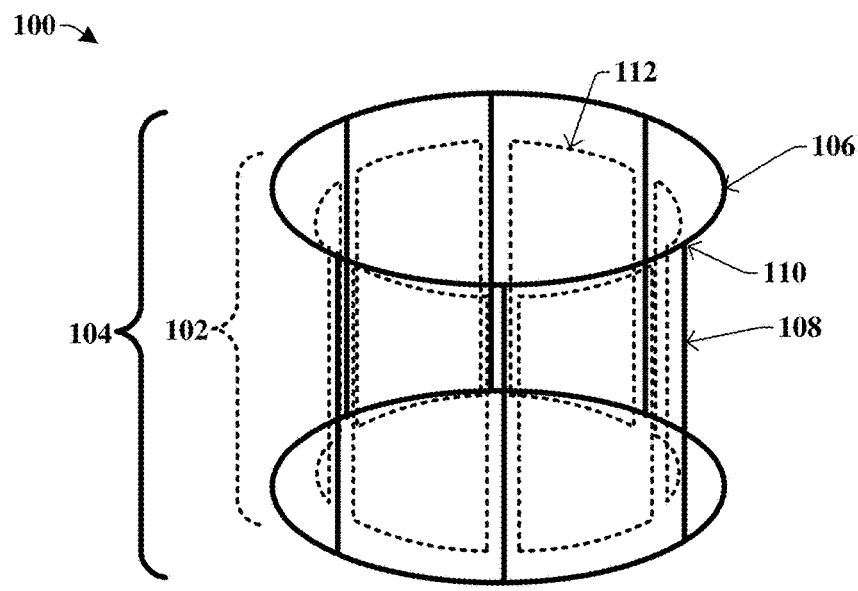
FIG. 1 illustrates a perspective view of some embodiments of a magnetic resonance imaging (MRI) radio frequency (RF) coil array comprising a birdcage coil surrounding circumferentially arranged RF coil elements.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phased array technology is a traditional and widely used approach to build a multiple channel magnetic resonance (MR) coil for magnetic resonance imaging (MRI) applications. Phased array technology provides a large-coil-like signal penetration while having the high signal performance of a small coil at a shallow depth. To improve isolation between two direct neighbor coils, the direct neighbor coil elements may be overlapped with one another for minimized mutual inductance. To reduce isolation between non-direct neighbor coil elements, a low input impedance preamplifier may be used. Even with preamplifier decoupling, isolation between coil elements without preamplifiers is important for signal-to-noise ratio (SNR).

Besides the overlapping approach, which is one type of a transformer approach, other isolation techniques used to improve the SNR of phased array coils include a capacitor approach to achieve isolation between two coil elements. For example, a capacitor ladder network has shown to isolate up to nine coil elements. If the number of RF coil elements is high (e.g., more than 12), and the RF coil elements cover a cylindrical like anatomy with multiple rows (e.g., two rows or more), it is difficult to use the aforementioned approaches to isolate all RF coil elements because of the high number of coil-element pairings. For example, if there are three rows and eight RF coil elements per row, then the total pairs of RF coil elements amounts to 276 based on the calculation of 24 RF coil elements multiplied by 23 pairings per RF coil element divided by 2 to remove duplicate RF coil elements.

Typically, overlapping may be used to decouple direct neighbor RF coil elements, and coupling between distant coil elements can be ignored as it is intrinsically small.

However, in the cylindrical shaped coil with multiple rows, the couplings between non-direct neighbors in the same row and the couplings between non-direct neighbors between two adjacent rows are still quite large and cannot be ignored. A cylindrical shaped coil may be used to continuously surround the whole body or a body part (e.g., a leg, a knee, an arm, a hand, a wrist, a head, etc.) for MRI. In a cylindrical shaped coil with multiple rows, the total number of large couplings that cannot be ignored can quickly become a huge number. For example, for 24 RF coil elements, one RF coil element in the middle row may couple to five RF coil elements in the middle row and six RF coil elements each for two neighboring rows. Thus, the one RF coil element may couple with seventeen other RF coil elements. It is not practical to decouple RF coil elements using transformers, capacitors, or capacitor ladder network approaches for this situation.

Another approach to decouple RF coil elements in a cylindrical shaped coil with multiple rows utilizes a decoupling ring between two adjacent rows to optimize decoupling and to reduce noise coupling. One challenge of the decoupling ring approach is that when there are more than two rows and therefore multiple decoupling rings, the multiple decoupling rings may couple to one another. Then, additional decoupling approaches may be needed to decouple the decoupling rings from one another such as geometrical decoupling (e.g., orthogonal field or overlapping).

Various embodiments of the present disclosure include a MRI radio frequency (RF) coil array comprising a birdcage coil surrounding RF coil elements in a cylindrical arrangement to reduce coupling between RF coil elements. The RF coil elements couple with the birdcage coil, and the coupling with the birdcage negates coupling amongst the RF coil elements, to improve the SNR of the MRI RF coil array. The RF coil elements may be receive (Rx) coil elements in a Rx mode of the MRI RF coil array or transmit (Tx) coil elements in a Tx mode of the MRI RF coil array. Similarly, the birdcage coil may be a Rx coil in the Rx mode or a Tx coil in the Tx mode. In some embodiments, the RF coil elements are used as Rx coil elements in the Rx mode while the birdcage coil provides decoupling, and the birdcage coil is used as a Tx coil in the Tx mode while the RF coil elements are disabled.

If the MRI RF coil array has more than two rows of the RF coil elements, such as three rows, then two or more birdcage coils are used to reduce coupling between adjacent rows. In some embodiments, when two or more birdcage coils are used, the birdcage coils overlap with one another to reduce coupling between the two direct neighboring birdcage coils. Thus, with the addition of one or more birdcage coils surrounding one or more rows of MRI RF coil array in a cylindrical arrangement, coupling between RF coil elements is reduced thereby increasing the SNR and improving reliability of the MRI RF coil array.

FIG. 1 illustrates a perspective view 100 of some embodiments of a MRI RF coil array comprising a birdcage coil arranged around a row of RF coil elements in a cylindrical arrangement.

The MRI RF coil array of FIG. 1 includes a row 102 of RF coil elements 112 in a cylindrical arrangement. In other words, in some embodiments, the RF coil elements 112 circumferentially surround a cylindrical axis. In some embodiments, the row 102 of RF coil elements 112 comprises at least three RF coil elements 112. In some embodiments, the row 102 of RF coil elements 112 are defined wholly or partially by a cylindrical former (not shown), which is a housing structure used to support and maintain the configuration of the MRI RF coil array in the cylindrical arrangement. In some embodiments, the MRI RF coil array of FIG. 1 is in a cylindrical arrangement such that a body part (e.g., head, arm, leg, etc.) or a whole body can be fully surrounded by the RF coil elements 112 for imaging by MRI.

In some embodiments, the RF coil elements 112 comprise a conductive wire (e.g., copper) arranged in loops or coils and may further comprise various circuits and circuit elements such as capacitors, amplifiers, diodes and/or the like. In some embodiments, each RF coil element 112 has a same structure (e.g., size, circuitry, material, etc.). In other embodiments, some or all of the RF coil elements 112 may have different structures (e.g., size, circuitry, material, etc.) from one another. In the perspective view 100 of FIG. 1, the aforementioned conductive wire, circuits, and circuit elements are not included for ease of understanding.

In some embodiments, the RF coil elements 112 may be used as receive (Rx) coil elements in a Rx mode of the MRI RF coil array. For example, the RF coil elements 112 may be used as a phased array Rx coil. In other embodiments, the RF coil elements 112 may be used as transmit (Tx) coil elements in a Tx mode of the MRI RF coil array. For example, the RF coil elements 112 may be used as a parallel Tx coil. Thus, each RF coil element 112 in the row 102 sends and/or receives RF pulses to the body part during imaging by MRI. To improve the quality of the image produced by MRI, the signal to noise ratio (SNR) of the RF pulses may be increased. Noise may be created by mutual inductance between two RF coil elements 112. Therefore, improving isolation between RF coil elements 112 may increase the SNR of all or a subset of RF coil element 112 in the row 102.

In some embodiments, a birdcage coil 104 is arranged around the row 102 of RF coil elements 112, such that the birdcage coil 104 inductively couples with the RF coil elements 112. Further, as described in more detail hereafter with regard to FIG. 4, an impedance and/or a resonant frequency of the birdcage coil 104 is/are configured such that the couplings from the birdcage coil 104 to the RF coil elements 112 wholly or partially negate the couplings between the RF coil elements 112. As a result, the birdcage coil 104 improves the SNR of all or a subset of the RF coil element 112. In some embodiments, the resonant frequency of the birdcage coil 104 is different (e.g., greater or less) than the working frequency (e.g., Larmor frequency) of the MRI RF coil array. The working frequency refers to the frequency of the RF pulses provided by the MRI RF coil array that are used to excite nuclei (e.g., hydrogen nuclei) and to cause the nuclei to emit MRI signals for image processing. The resonant frequency of the birdcage coil 104 refers to the resonant frequency of the birdcage coil 104 in isolation.

In some embodiments, the birdcage coil 104 circumferentially and completely surrounds the row 102 of RF coil elements 112. In some embodiments, the birdcage coil 104 is arranged outside of the row 102 of RF coil elements 112 such that the row 102 of RF coil elements 112 is arranged between the cylindrical axis and the birdcage coil 104. In some embodiments, the birdcage coil 104 comprises rungs 108 that extend in parallel with the cylindrical axis and extend between and are attached 110 to two end rings 106.

In FIG. 1, the row 102 comprises six RF coil elements 112, and the birdcage coil 104 comprises six rungs 108. However, it will be appreciated that FIG. 1 is a non-limiting example. In other embodiments, the number of rungs 108 may different than (e.g., less than or more than) the number of RF coil elements 112. Further, in other embodiments, the row 102 may have more or less RF coil elements 112 and/or the birdcage coil 104 may have more or less rungs 108. Beyond RF coil elements and rungs, the first row 102 and the birdcage coil 104 may also comprise various circuits and circuit elements such as capacitors, amplifiers, diodes and/or the like, which are not illustrated in the perspective view 100 of FIG. 1 for ease of understanding.

Figure 2:
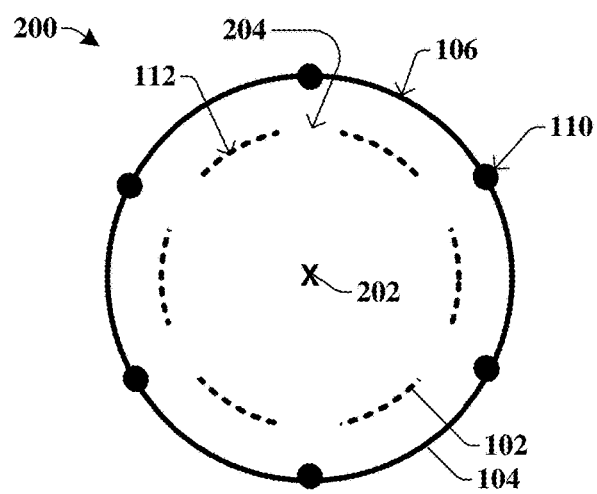
FIGS. 2 and 3 illustrate top views of some embodiments of a birdcage coil surrounding circumferentially arranged RF coil elements.

FIG. 2 illustrates a top view 200 of some embodiments of the MRI RF coil array corresponding to the perspective view 100 of FIG. 1.

The top view 200 of FIG. 2 illustrates a center 202 of the row 102 of RF coil elements 112 which corresponds to the cylindrical axis. The cylindrical axis is not illustrated in FIG. 1 for ease of illustration. However, it will be appreciated that the cylindrical axis corresponds to and intersects with the center 202 in FIG. 2 and would extend into and out of the page. In some embodiments, each RF coil element 112 is spaced apart from the center 202 of the MRI RF coil array by a same distance. In some embodiments, the RF coil elements 112 are spaced apart from one another by a space 204. In some embodiments, the space 204 is substantially equal between each RF coil element 112. In other embodiments, the space 204 varies between each RF coil element 112. In some embodiments, the space 204 is arranged directly between the center 202 and the rungs (108 of FIG. 1) of the birdcage coil 104. It will be appreciated that the rungs (108 of FIG. 1) are arranged behind where the rungs (108 of FIG. 1) are attached 110 to the end ring 106. Thus, the attachment 110 between the end ring 106 and the rungs (108 of FIG. 1) is illustrated by a black circle in FIG. 2 for emphasis of the location of the rungs (108 of FIG. 1).

Figure 3:
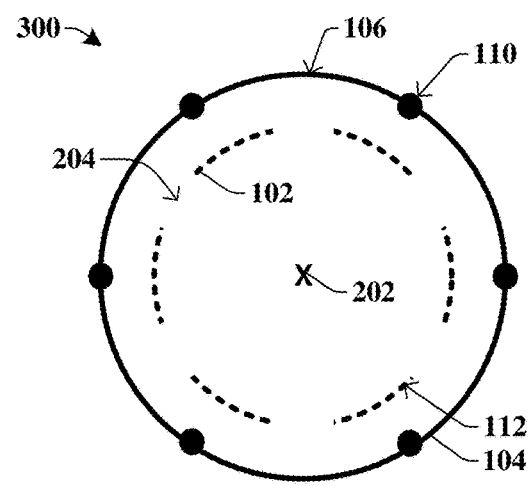

FIG. 3 illustrates a top view 300 of some alternative embodiments of the arrangement of a bird cage coil and RF coil elements.

In some other embodiments, the space 204 is not arranged directly between the rungs (108 of FIG. 1) and the center 202. Instead, in some embodiments, each RF coil element 112 is arranged directly between the rungs (108 of FIG. 1) and the center 202. In some other embodiments, wherein the number of RF coil elements 112 is different than the number of rungs (108 of FIG. 1) of the birdcage, the spatial relationship between the RF coil elements 112 and the rungs (108 of FIG. 1) may be a combination of FIGS. 2 and 3. For example, in some embodiments, some of the RF coil elements 112 may be arranged directly between the center 202 and the rungs (108 of FIG. 1), whereas some other RF coil elements 112 may not be arranged directly between the center 202 and the rungs (108 of FIG. 1). Further in some other embodiments, the RF coil elements 112 may overlap with one another, and thus, the space 204 does not exist (e.g., see, FIG. 6A).

Figure 4:
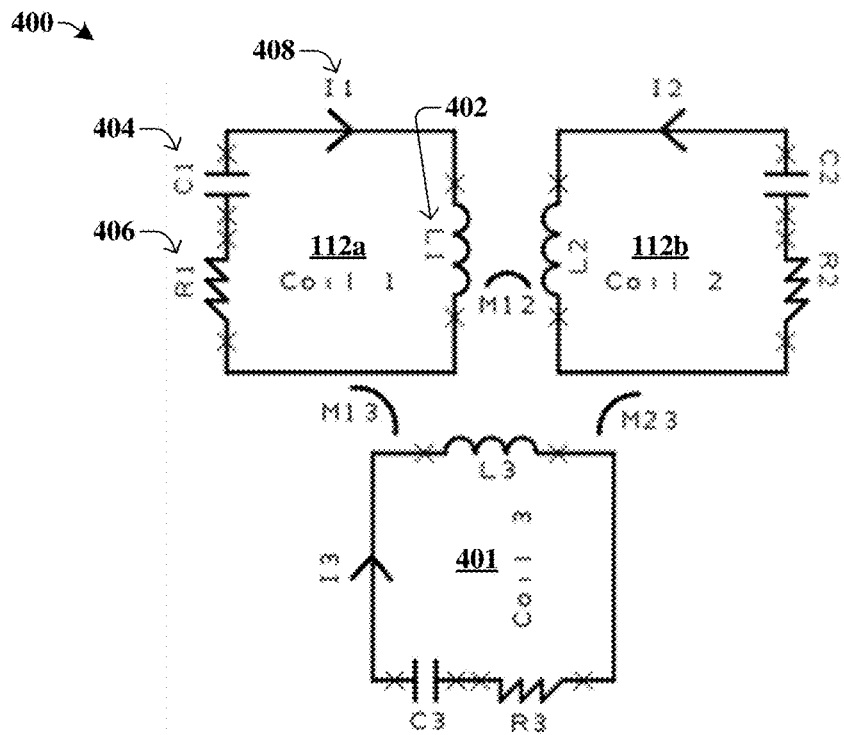
FIG. 4 illustrates a circuit diagram of some embodiments of three coil elements coupled to one another through mutual inductance.

FIG. 4 illustrates a circuit diagram 400 to illustrate how introducing a third coil through a bird cage coil may negate mutual inductance between two RF coil elements.

The circuit diagram 400 of FIG. 4 illustrates a first RF coil element 112a arranged beside a second RF coil element 112b. Further, a third coil element 401 is arranged below the first and second RF coil elements 112a, 112b. In some embodiments, the first and second RF coil elements 112a, 112b correspond to two of the RF coil elements 112 of FIG. 1, and the third coil element 401 corresponds to the birdcage coil 104 of FIG. 1. In some embodiments, each of the first and second RF coil elements 112a, 112b and the third coil element comprise a coil trace inductor 402, a breaking point capacitor 404, and coil loss 406. The coil loss 406 includes copper loss, phantom loss, and RF radiation loss.

In the first RF coil element 112a, the coil trace inductor 402, the breaking point capacitor 404, and the coil loss 406 are labeled as $L_1$, $C_1$, and $R_i$, respectively. In the second RF coil element 112b, the coil trace inductor 402, the breaking point capacitor 404, and the coil loss 406 are labeled as $L_2$, $C_2$, and $R_2$, respectively. In the third coil element 401, the coil trace inductor 402, the breaking point capacitor 404, and the coil loss 406 are labeled as $L_3$, $C_3$, and $R_3$, respectively. The mutual inductance between the first and second RF coil elements 112a, 112b is symbolized as $M_{12}$. The mutual inductance between the first RF coil element 112a and the third coil element 401 is symbolized as $M_{13}$. The mutual inductance between the second RF coil element 112b and the third coil element 401 is symbolized as $M_{23}$. For simplicity, matching circuits and other supporting circuits for the first and second RF coil elements 112a, 112b and for the third coil element 401 are not shown in FIG. 4.

Eqs. 1 through 6 will be presented to show how a third coil element 401 can reduce the noise between the two RF coil elements 112a, 112b, wherein the two RF coil elements 112a, 112b are direct neighbors (i.e., arranged directly next to one another). First, the noise between the first RF coil element 112a and the second RF coil element 112b without the third coil element 401 is examined. Analyzing the first and second RF coil elements 112a, 112b in the absence of the third coil element 401 and using Kirchhoff's law yields the following:

$$\begin{cases} I_1\left(j\omega L_1 - j\frac{1}{\omega C_1} + R_1\right) + j\omega M I_2 = 0 \\ I_2\left(j\omega L_2 - j\frac{1}{\omega C_2} + R_2\right) + j\omega M I_1 = 0 \end{cases} \quad \text{Eq. 1}$$

In Eq. 1, ω is the angular frequency. If the second RF coil element 112b does not exist, then the noise of the first RF coil element 112a is $\sqrt{R_1}$. However, because the second RF coil element 112b does exist and there is a non-zero mutual inductance $M_{12}$ between the first and second RF coil elements 112a, 112b, the noise of the first RF coil element 112a includes a transfer noise from the second RF coil element 112b. Therefore, the total noise of the first RF coil element 112a is about equal to $\sqrt{R_1+(\omega M_{12})^2/R_2}$. Thus, the second RF coil element 112b will create noise for the first RF coil element 112a.

In some embodiments, to reduce the noise, a low input impedance preamplifier can be used to create preamplifier decoupling. In such embodiments, $R_2$ is replaced with $R_2+R_{preamplifier-decoupling}$. Further, $R_{preamplifier-decoupling}$ is much larger than $R_2$ and, thus, the total noise of the first RF coil element 112a is reduced when a low input impedance preamplifier is added to the first RF coil element 112a. However, even with a low input impedance preamplifier, in some embodiments, the noise that the first RF coil element 112a experiences may still be high depending on the magnitude of the mutual inductance $M_{12}$ between the first and second RF coil elements 112a, 112b. Thus, the third coil element 401 is added to improve the SNR of the first and second RF coil elements 112a, 112b. Below is Eq. 2, which describes the first and second RF coil elements 112a, 112b together with the third coil element 401 using Kirchhoff's law:

$$\begin{cases} I_1\left(j\omega L_1 - j\dfrac{1}{\omega C_1} + R_1\right) + j\omega M_{12}I_2 + j\omega M_{13}I_3 = 0 & (1) \\ I_2\left(j\omega L_2 - j\dfrac{1}{\omega C_2} + R_2\right) + j\omega M_{12}I_1 + j\omega M_{23}I_3 = 0 & (2) \\ I_3\left(j\omega L_3 - j\dfrac{1}{\omega C_3} + R_3\right) + j\omega M_{13}I_1 + j\omega M_{23}I_2 = 0 & (3) \end{cases} \quad \text{Eq. 2}$$

If the term $$\left(j\omega L_i - j\frac{1}{\omega C_i} + R_i\right)$$

is represented by $Z_i$, then the second expression of Eq. 2 may be written as Eq. 3 below:

$$I_3 = -\frac{j\omega M_{13}}{Z_3}I_1 - \frac{j\omega M_{23}I_2}{Z_3} \quad \text{Eq. 3}$$

If the expression of $I_3$ of Eq. 3 is substituted for $I_3$ in the first or second expression of Eq. 2, then the result is Eq. 4 below:

$$I_1\left(Z_1 + \frac{(\omega M_{12})^2}{Z_3}\right) + \left(j\omega M_{12} + \frac{\omega^2 M_{13}M_{23}}{Z_3}\right)I_2 = 0 \quad \text{Eq. 4}$$

As seen in Eq. 4, if Eq. 5 below is true, the second term in Eq. 4 is zero or otherwise small and hence a variation in the current $I_2$ of the second RF coil element 112b will not or will only minimally influence the current $I_1$. In other words, the first RF coil element 112a is decoupled from the second RF coil element 112b. Because mutual inductance is largely fixed, Eq. 5 may be satisfied by appropriately selecting the impedance $Z_3$ of the third coil element 401.

$$\left(j\omega M_{12} + \frac{\omega^2 M_{13}M_{23}}{Z_3}\right) = 0 \text{ or very small} \quad \text{Eq. 5}$$

In some embodiments, to satisfy Eq. 5, the impedance $Z_3$ of the third coil element 401 is selected to have an opposite sign than the mutual inductance $M_{12}$ between the first and second RF coil elements 112a 112b and is selected such that the first term of Eq. 5 ($j\omega M_{12}$) has an absolute value about equal to the second term of Eq. 5

$$\left(\frac{\omega^2 M_{13}M_{23}}{Z_3}\right).$$

When Eq. 5 is satisfied, the first and second RF coil elements 112a, 112b are coupled to the third coil element 401 and the new coil loss of the first RF coil element 112a is expressed in Eq. 6:

$$R_{newcoil1} = R_1 + \frac{(\omega M_{12})^2}{|Z_3|} + \frac{\left(j\omega M_{12} + \dfrac{\omega^2 M_{13}M_{23}}{Z_3}\right)\left(j\omega M_{12} + \dfrac{\omega^2 M_{13}M_{23}}{Z_3}\right)^*}{\dfrac{(\omega M_{12})^2}{|Z_3|} + R_{preamp\_decoupling}} \quad \text{Eq. 6}$$

Eq. 6 shows that the coupled noise from the second RF coil element 112b is significantly reduced because $$\left(j\omega M_{12} + \frac{\omega^2 M_{13}M_{23}}{Z_3}\right)$$

is equal to zero or very small. However, there is still additional noise from the third coil element 401 because there is current $I_3$ flowing through the third coil element 401 to achieve decoupling between the first and second RF coil elements 112a, 112b. The noise from the third coil element 401 is equal to $$\frac{(\omega M_{12})^2}{|Z_3|}.$$

A qualitative estimation can be conducted to determine whether the noise from the third coil element 401 is large or small.

The third coil element 401 may be a high qualify factor (Q) coil. Such a high Q coil may have a Q value of 100 or more. Further, it can be assumed that the coil loss resistor $R_3$ of the third coil element 401 is at the same level as the coil loss $R_1$ of the first RF coil element 112a. Further yet, the resonant frequency of the third coil element 401 is set to a higher or lower value than the working frequency, depending on the coupling condition between the first and second RF coil elements 112a, 112b. Therefore, the impedance $Z_3$ of the third coil element 401 at the working frequency could be at the level of the Q value of the third coil element 401 times the coil loss $R_3$ of the third coil element 401.

If the coil loss $R_2$ of the second RF coil element 112b is matched to 50 Ohms and if the preamplifier input impedance is 5 Ohms, then the $R_{preamp\_decoupling}$ equals 10 times the coil loss $R_2$ of the second RF coil element 112b. $R_{preamp\_decoupling}$ being equal to 10 times $R_2$ is much smaller than the charge of third coil element 401 times the coil loss $R_3$ of the third coil element 401 when the Q value is greater than 100. Because the terms "Q×$R_3$" and "10×$R_2$" are denominators, the additional noise from the third coil element 401 is much smaller than noise from the second RF coil element 112b. In other words, the SNR of the first RF coil element 112a is improved by the third coil element 401. Further, the SNR of the second RF coil element 112b is also improved by the third coil element 401 is present.

Now, Eqs. 7-11 will be presented for more generally reducing coupling amongst coil elements (e.g., 112 of FIG. 1) in a MRI RF coil array using another independent coil (e.g., the birdcage coil 104 of FIG. 1). In other words, Eqs. 7-11 will use the principles in Equations 1-6 to show how a birdcage coil (e.g., 104 of FIG. 1) reduces noise between coil elements too.

In a more general case, wherein there are N-coil elements (e.g., 112 of FIG. 1) in a row (e.g., 102 of FIG. 1), it can be assumed that each of the N-coil elements couples to an independent coil such as the birdcage coil 104 of FIG. 1. The independent coil (e.g., birdcage coil 104 of FIG. 1) will be represented as $Coil_B$. The coil elements (e.g., RF coil elements 112 of FIG. 1) will be represented as i=1, . . . , N. For the coil element i, the coil loss $R_{coil\ i}$ is expressed in Eq. 7:

$$R_{coili} = R_i + \sum_{j=1\&j\neq i}^{N} \left( \frac{(\omega M_{ij})^2}{|Z_{coil_B}|} + \frac{\left(j\omega M_{ij} + \frac{\omega^2 M_{iB}M_{jB}}{Z_{coil_B}}\right)^* \left(j\omega M_{ij} + \frac{\omega^2 M_{iB}M_{jB}}{Z_{coil_B}}\right)}{\frac{(\omega M_{ij})^2}{|Z_{coil_B}|} + R_{preamp_{decoupling_j}}} \right) \quad \text{Eq. 7}$$

Further, because $$\frac{(\omega M_{ij})^2}{|Z_{coil_B}|} \ll R_{preamp_{decoupling_j}},$$

Eq. 7 can be simplified to Eq. 8:

$$R_{coili} = R_i + \sum_{j=1\&j\neq i}^{N} \left( \frac{(\omega M_{ij})^2}{|Z_{coil_B}|} + \frac{\left(j\omega M_{ij} + \frac{\omega^2 M_{iB}M_{jB}}{Z_{coil_B}}\right)^* \left(j\omega M_{ij} + \frac{\omega^2 M_{iB}M_{jB}}{Z_{coil_B}}\right)}{R_{preamp_{decoupling_j}}} \right) \quad \text{Eq. 8}$$

If the impedance of the independent coil $Z_{coilB}$ is set to have an opposite sign as $j\omega M_{ij}$ for most of the N-coil elements, then the coil loss $R_{coil\ i}$ of each coil element i can be reduced significantly compared to when the independent coil $coil_B$ is not used. The significant reduction in the coil loss $R_{coil\ i}$ of each coil element i is because the additional noise from $$\frac{(\omega M_{ij})^2}{|Z_{coil_B}|}$$

is very small as qualitatively estimated above. Setting the impedance of the independent coil $Z_{coilB}$ to reduce noise also has the effect of setting the resonant frequency of the independent coil $Z_{coilB}$. A resonance frequency is tuned to a value that is different than the working frequency and i that provides the best isolation between all or most of the coil elements i.

Eq. 8 may be better understood under the following example. If the independent coil element does not exist, then the impedance $Z_{coilB}$ of the independent coil is infinite. When $Z_{coilB}$ is infinite, Eq. 8 becomes $$R_{coili} = R_i + \sum_{j=1\&j\neq i}^{N} \left( \frac{(j\omega M_{ij})^*(j\omega M_{ij})}{R_{preamp_{decoupling_j}}} \right),$$

where the second term is the additional noise from mutual inductance $M_{ij}$ between coil elements (e.g., 112a, 112b). Thus, the additional noise is the sum of $(j\omega M_{ij}-0)^2$, where the "minus 0" represents the original coupling reference point regarding noise calculation. The mutual inductance $M_{ij}$ between coil elements (e.g., 112a, 112b) can be positive or negative depending on whether RF coil elements are over-overlapped or under-overlapped. For this example, it is assumed there are five coil elements in a RF coil array, all mutual inductances $M_{ij}$ are positive, and the four mutual inductance $M_{ij}$ values between the five coil elements are 0.1, 0.1, 0.2, and 0.2. Further, it will be assumed that $R_{preampdecoupling_j}$, $\omega$, and j are equal to 1. Therefore, the additional noise will be equal to $(0.1)^2+(0.1)^2+(0.2)^2+(0.2)^2=0.1$ when the independent coil is not present.

If the independent coil is introduced, then the mean value of all of the mutual inductances replaces the "minus zero" portion of the additional noise term $(j\omega M_{ij}-0)^2$. If the mean value of the mutual inductances is 0.15, then the new additional noise value is $(0.1-0.15)^2+(0.1-0.15)^2+(0.2-0.15)^2+(0.2-0.15)^2=0.01$. Thus, this simplified, non-limiting example shows that the introduction of the independent coil can reduce noise of the RF coil array by 90 percent in some embodiments.

Now, the effect of a symmetrical arrangement will be discussed. When the coil elements i and the independent coil $Coil_B$ are symmetrically arranged, the significant reduction in the coil loss $R_{coil\ i}$ of each coil element i is more apparent. An example of a symmetrical arrangement is illustrated in FIG. 1, wherein all of the coil elements i (e.g., 112 of FIG. 1) are wrapped and centered around a cylindrical axis. All of the coil elements i are the same size, and the independent coil $Coil_B$ is a birdcage coil (e.g., 104 of FIG. 1) arranged outside of the coil elements i and centered around the cylindrical axis. Because of the symmetry in FIG. 1, each coil element i (e.g., 112 of FIG. 1) has an equal mutual inductance with the birdcage coil (e.g., 104 of FIG. 1). The best isolation between coil elements i is achieved at least when the decoupling benefit provided by the birdcage coil (e.g., 104 of FIG. 1) is greater than the noise addition caused by the birdcage coil (e.g., 104 of FIG. 1). With these assumptions, Eq. 8 can be simplified to Eq. 9:

$$R_{coili} = R_{coil1} = R_1 + \sum_{j=2}^{N} \left( \frac{(\omega M_{1j})^2}{|Z_{coil_B}|} + \frac{\left(j\omega M_{1j} + \frac{(\omega M_{1B})^2}{Z_{coil_B}}\right)^* \left(j\omega M_{1j} + \frac{(\omega M_{1B})^2}{Z_{coil_B}}\right)}{R_{preamp_{decoupling_1}}} \right) \quad \text{Eq. 9}$$

The impedance of the independent coil $Z_{coilB}$ may be defined follows in Eq. 10:

$$Z_{coil_B} = -(N-1)\frac{(\omega M_{1B})^2}{\sum_{j=2}^{N} j\omega M_{1j}} = \frac{(\omega M_{1B})^2}{-j\omega \overline{M}}, \text{ where } \overline{M} = \frac{\sum_{j=2}^{N} M_{1j}}{N-1}. \quad \text{Eq. 10}$$

By substituting $Z_{coil_B}$ into Eq. 9, Eq. 9 may be simplified as Eq. 11:

$$R_{coili} = R_1 + \sum_{j=2}^{N} \frac{(\omega M_{1j})^2}{|Z_{coil_B}|} + \sum_{j=2}^{N} \frac{(\omega M_{1j})^2}{R_{preamp_{decoupling_1}}} - \sum_{j=2}^{N} \frac{(\omega \overline{M})^2}{R_{preamp_{decoupling_1}}} \quad \text{Eq. 11}$$

In Eq. 11, the first term $R_1$ is the coil loss itself. The second term of Eq. 10 is the additional noise from the independent coil $Coil_B$ because there is current flowing through the independent coil $Coil_B$. The third term of Eq. 10 is the noise from mutual inductance among coil elements i having preamplifier decoupling, which is a positive value. The fourth term of Eq. 10 is the noise reduction term because of the presence of the independent coil $Coil_B$. As described above, the second term of Eq. 10 may be negligible and the fourth term may be significant. Thus, setting an impedance $Z_{coil_B}$ as in Eq. 10 may significantly reduce the noise of all or most of independent coil elements i to improve the SNR and the image quality during an MRI application.

Further, it will be appreciated that the method discussed in Eqs. 7-11 is also applicable to parallel transmission (pTx) coil embodiments where no impedance preamplifier is used but an RF power amplifier is used. For example, a 50 Ohm RF power amplifier may be used. In applying Eqs. 7-11 to parallel transmission, $R_{preamp_{decoupling}}$ may, for example, be replaced by $R_{rfpower}$, where $R_{rfpower}$ corresponds to the output impedance of the RF power amplifier. In a pTx coil embodiment, the isolations among different RF Tx coil elements are important for reducing Tx power coupling.

Figure 5:
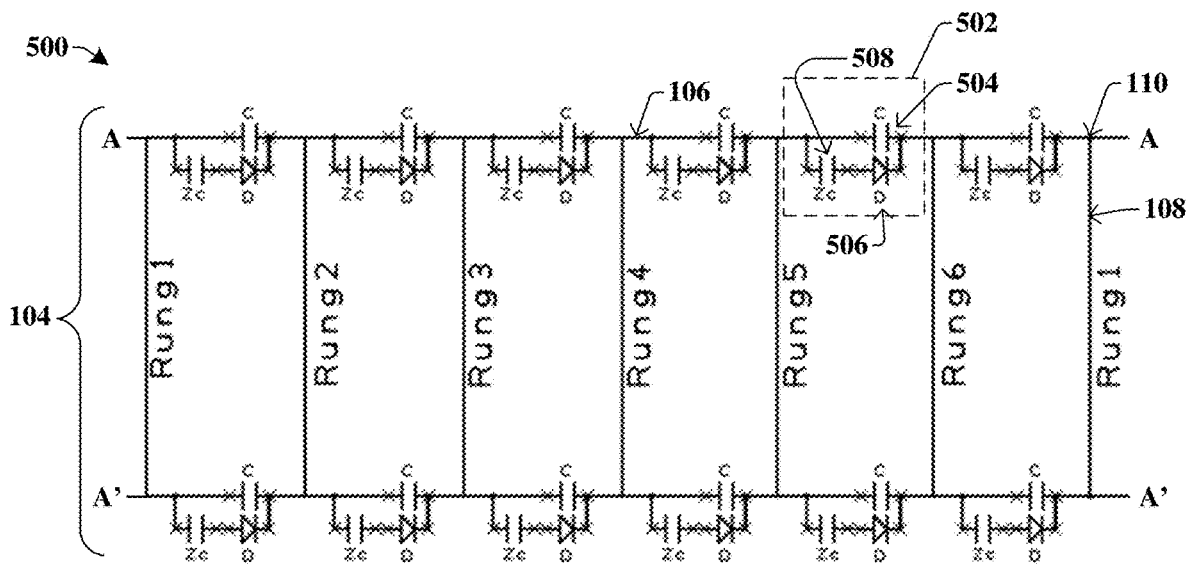
FIG. 5 illustrates a circuit diagram of some embodiments of a birdcage coil.

FIG. 5 illustrates a non-limiting circuit diagram 500 of some embodiments of a birdcage coil 104 in which the birdcage coil 104 is employed for decoupling the RF elements 112 of FIG. 1 (not shown) in a Rx mode of an MRI RF coil array and is employed for transmission in a Tx mode of the MRI RF coil array.

More specifically, the circuit diagram 500 of FIG. 5 represents some embodiments of the birdcage coil 104 of FIG. 1 in which the birdcage coil 104 is a high pass birdcage coil 104 having six rungs 108. In other embodiments, the birdcage coil 104 may be a lowpass and/or bandpass birdcage coil for decoupling and Tx purposes. It will be appreciated that in other embodiments, the birdcage coil 104 may have more or less than six rungs 108. Further, it will be appreciated that the circuit diagram 500 of FIG. 5 illustrates the birdcage coil 104 in a "laid out," flat arrangement for ease of understanding, instead of in the cylindrical arrangement as shown, for example, in FIG. 1. Thus, terminals A may meet with one another when in the cylindrical arrangement, and terminals A' may meet with one another when in the cylindrical arrangement.

In some embodiments, the birdcage coil 104 may comprise circuitry 502 on the end rings 106 of the birdcage coil 104. In some embodiments, the circuitry 502 may comprise C capacitors 504, PIN diodes 506, and reactive elements 508. In some embodiments, the reactive element 508 is a capacitor or an inductor, for example.

In some embodiments when the birdcage coil 104 is operating in the Tx mode, the PIN diodes 506 are ON (e.g., may be modeled as electrical shorts). As such, the C capacitors 504 are electrically coupled in parallel with the reactive elements 508, respectively. In some embodiments when the birdcage coil 104 is in the Tx mode, the reactive elements 508 are chosen so the resonant frequency of the birdcage coil 104 is equal to the working frequency. In some embodiments, the birdcage coil 104 further comprises matching and other supporting circuits which are not shown in FIG. 5 for ease of understanding.

In some embodiments when the birdcage coil 104 is operating in the Rx mode, the PIN diodes 506 are OFF (e.g., may be modeled as electrically open). As such, the reactive elements 508 are not electrically coupled in parallel with the C capacitors 504, respectively. Hence, the birdcage coil 104 has a resonant frequency different than the working frequency and tuned for decoupling the RF coil elements 112 (not shown). In other words, the birdcage coil 104 has an impedance tuned for decoupling the RF coil elements 112. For example, the impedance may be set according to Eq. 10.

In some embodiments, the PIN diodes 506 are controlled by an external controller (not shown). For example, the external controller may forward bias the PIN diodes 506 with a DC voltage to turn the PIN diodes 506 to ON states, and may reverse bias the PIN diodes 506 with a DC voltage to turn the PIN diodes 506 to OFF states.

Figure 6A:
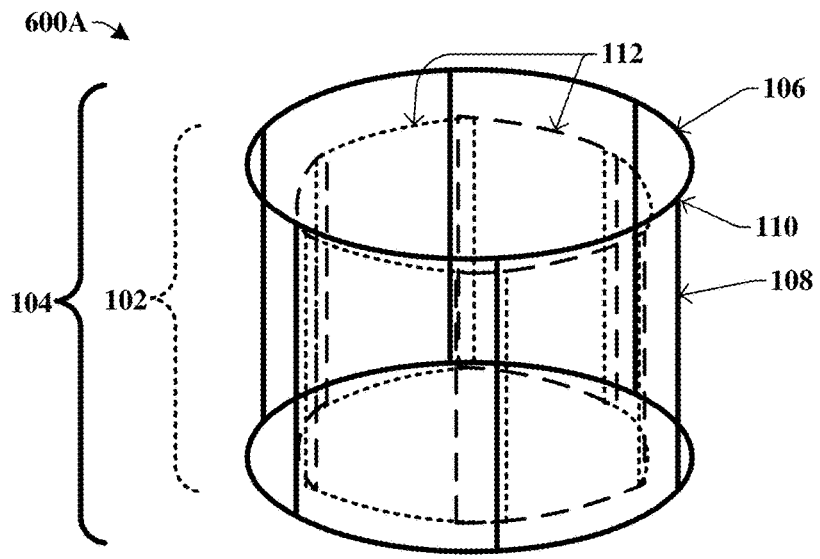
FIGS. 6A-6D illustrate various views of some embodiments of a MRI RF coil array comprising a birdcage coil that surrounds overlapping RF coil elements.
Figures 6B, 6C:
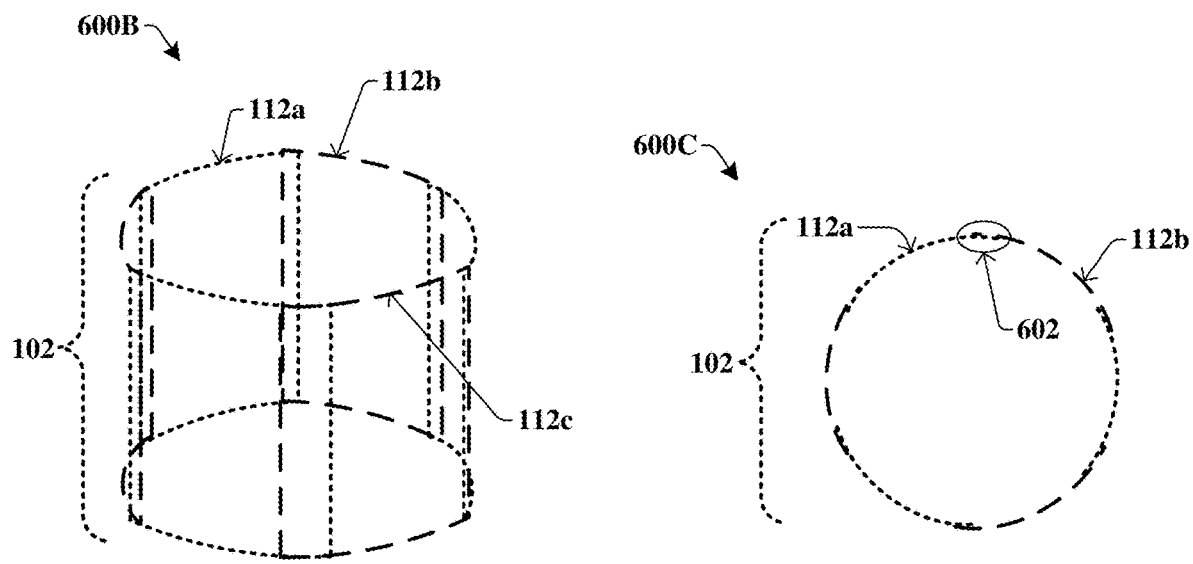

FIGS. 6A-C illustrate various views 600A-C of some alternative embodiments of a birdcage coil surrounding a row of overlapping RF coil elements.

As shown in perspective view 600A of FIG. 6A, in some embodiments, the RF coil elements 112 within a same row 102 overlap with one another. To visualize the overlapping arrangement in FIG. 6A, every other RF coil element 112 is represented with a small hash line or a large hash line. Although the RF coil elements 112 are represented with two different types of line styles, it will be appreciated that the RF coil elements 112 in the row 102 in FIG. 6A may still have a same structure as one another in some embodiments. In some of such embodiments, the overlapping arrangement of the RF coil elements 112 reduces mutual inductance and achieves noise reduction between direct neighboring RF coil elements 112. In some embodiments, the birdcage coil 104 is still coupled to each RF coil element 112 to reduce noise significantly at least among non-direct neighboring RF coil elements 112. Thus, in some embodiments, overlapping techniques between RF coil elements 112 and a birdcage coil 104 arranged around the row 102 of RF coil elements 112 can together significantly decrease coupling between all RF coil elements 112 to improve the SNR of the overall MRI RF coil array.

There are various ways that the birdcage coil 104 can be controlled to improve isolation between the RF coil elements 112. In one example, the birdcage coil 104 can be set to two frequencies using diodes. The first frequency may be equal to the working frequency in Tx mode, and the second frequency is the decoupling frequency in Rx mode that is different than the working frequency. In another example, the birdcage coil 104 may comprise decoupling circuits for decoupling Tx power during Tx mode. In yet another example, the birdcage coil 104 may be driven in linear, quadrature, or pTx modes if a direct connection to control circuitry is being used. Further, a flow diagram is presented in FIG. 11 to provide an example of a method 110 of how isolation may be achieved using the overlap of RF coil elements 112 and a birdcage coil 104 as illustrated in FIG. 6A.

FIG. 6B illustrates a perspective view 600B of some embodiments of the row 102 of RF coil elements 112 in FIG.

6A without the birdcage coil 104 such that the overlapping arrangement of the RF coil elements 112 is easier to understand.

Further, a first RF coil element 112a is arranged next to and overlaps with a second RF coil element 112b in FIG. 6B. Because the first RF coil element 112a is arranged directly next to the second RF coil element 112b, the first and second RF coil elements 112a, 112b are referred to as "direct neighboring" coil elements. In some embodiments, the overlapping between the RF coil elements 112 substantially reduces noise between direct neighboring coil elements (e.g., 112a and 112b). The row 102 in FIG. 6B also includes a third RF coil element 112c. The third RF coil element 112c is considered a "non-direct neighbor" with the first and second RF coil elements 112a, 112b because the third RF coil element 112c is not arranged directly next to the first or second RF coil elements 112a, 112b along the circumference of the cylindrical arrangement. However, because the third RF coil element 112c is across from the first and second RF coil elements 112a, 112b in the cylindrical arrangement, noise between the third RF coil element 112c and the first or second RF coil elements 112a, 112b is a concern. Thus, the birdcage coil (104 of FIG. 6A) is arranged around the row 102 of RF coil elements 112 to reduce noise between at least the non-direct neighboring RF coil elements 112.

FIG. 6C illustrates a top view 600C of some embodiments of RF coil elements overlapping with one another.

As shown in the top view 600C of FIG. 6C, in some embodiments, the first RF coil element 112a overlaps with the second RF coil element 112b at an overlapping area 602. In some embodiments, the overlapping area 602 is the same between each of the RF coil elements 112 in the row 102. Further, in some embodiments, the RF coil elements 112 may comprise low input impedance preamplifiers (not shown) to improve isolation between direct neighboring RF coil elements (e.g., 112a, 112b).

Figure 6D:
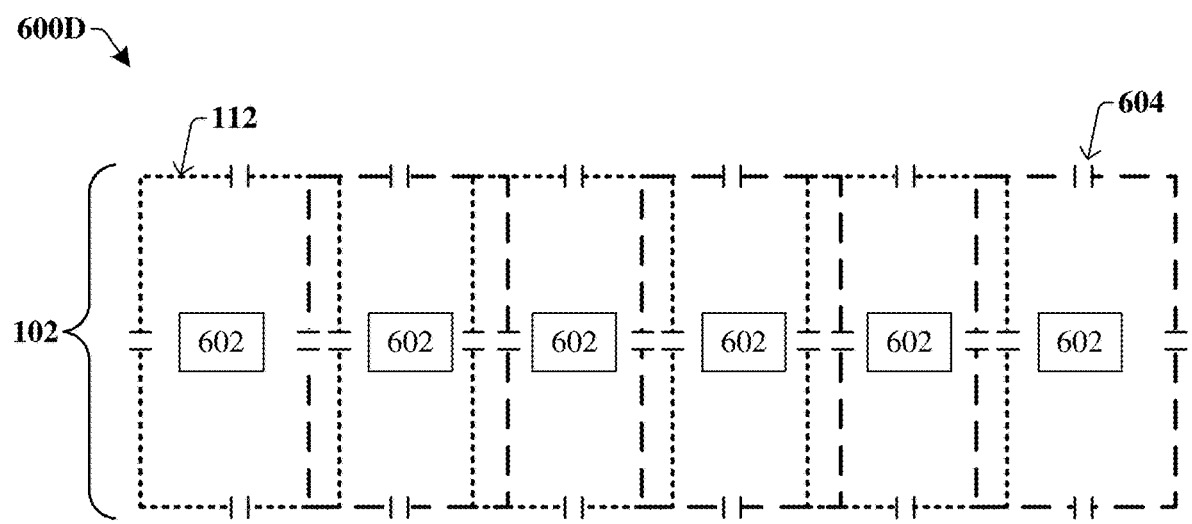

FIG. 6D illustrates a non-limiting circuit diagram 600D of some embodiments of the row 102 of RF coil elements 112.

The circuit diagram 600D illustrates a laid out view of the row 102 of RF coil elements 112 such that the overlapping between the RF coil elements 112 is more easily understood. The outer RF coil elements 112 of FIG. 6D would overlap with one another when the circuit diagram 600D is circumferentially arranged around a cylindrical axis as in FIG. 6B, for example. In some embodiments, each RF coil element 112 comprises multiple capacitors 604 and receive circuitry 602. In some embodiments, the receive circuitry 602 may comprise a matching circuit, a preamplifier, some other suitable receive circuitry, or a combination of the foregoing.

Figure 7A:
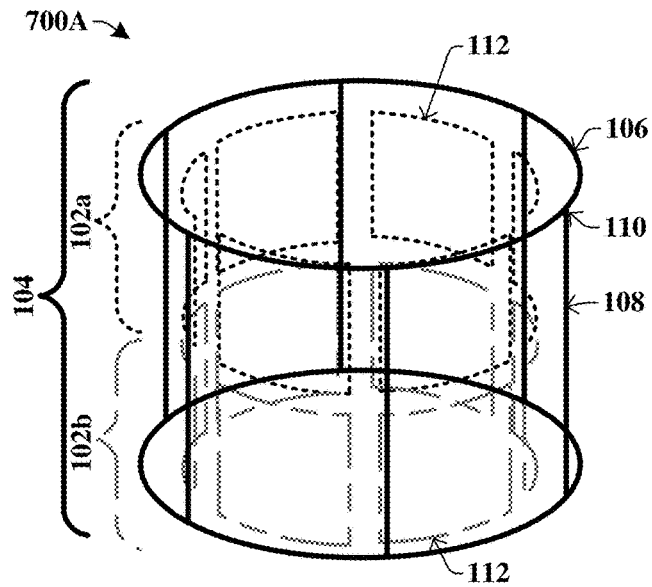
FIGS. 7A-7D illustrate various perspective views of some embodiments of a MRI RF coil array comprising a birdcage coil surrounding two rows of circumferentially arranged RF coil elements.

FIG. 7A illustrates a perspective view 700A of some embodiments of an MRI RF coil array comprising a birdcage coil surrounding two rows of RF coil elements.

In some embodiments, an MRI RF coil array comprises a first row 102a of RF coil elements 112 and a second row 102b of RF coil elements 112. In some embodiments, the RF coil elements 112 of the first row 102a comprise short dashed lines, whereas the RF coil elements 112 of the second row 102b comprise longer dashed lines. The difference in the lines of the RF coil elements 112 of the first and second rows 102a, 102b is for ease of understanding and differentiating between the first and second rows 102a, 102b. In some embodiments, the RF coil elements 112 of the first and second rows 102a, 102b have a same structure. In some other embodiments, the RF coil elements 112 of the first row 102a may have a different structure than the RF coil elements 112 of the second row 102b.

In some embodiments, the first row 102a of RF coil elements 112 is arranged over the second row 102b of RF coil elements 112. In some embodiments, the second row 102b circumferentially surrounds and is centered around the cylindrical axis like the first row 102a. In some embodiments, the second row 102b is offset form the first row 102a along the cylindrical axis.

In some embodiments, one birdcage coil 104 still circumferentially surrounds the first row 102a and the second row 102b of RF coil elements 112. In some embodiments, the birdcage coil 104 completely surrounds the first and second rows 102a, 102b. In some embodiments, the birdcage coil 104 comprises six rungs 108; the first row 102a comprises six RF coil elements 112; and the second row 102b comprises six RF coil elements 112. Thus, in some embodiments, the first and second row 102a, 102b each comprise a same number of RF coil elements 112. In other embodiments, the first and second row 102a, 102b each comprise a different number of RF coil elements 112. Further, in some embodiments, the birdcage coil 104 comprises a same number of rungs 108 as the number of RF coil elements 112 in the first and/or second rows 102a, 102b. In other embodiments, the birdcage coil 106 comprises a different number of rungs 108 than the number of RF coil elements 112 in the first and/or second rows 102a, 102b. Nevertheless, the birdcage coil 104 couples to the RF coil elements 112 in the first and second rows 102a, 102b to reduce noise between all or some (e.g., most) of the RF coil elements 112 in the first and second rows 102a, 102b.

Figure 7B:
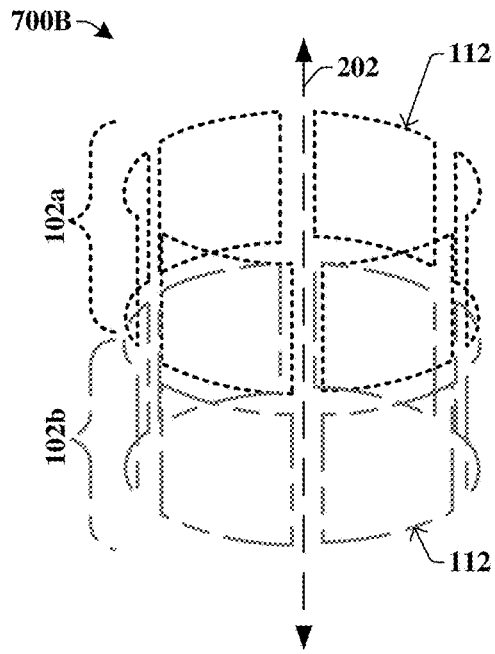

FIG. 7B illustrates a perspective view 700B of some embodiments of the first and second rows 102a, 102b of RF coil elements 112 in FIG. 6A without the birdcage coil 104 so that it is easier to see the first and second rows 102a, 102b.

In some embodiments, the RF coil elements 112 in the first row 102a are arranged directly and respectively over the RF coil element 112 in the second row 102b. In some embodiments, the RF coil elements 112 of the first row 102a are offset by a common distance from the RF coil elements 112 of the second row 102b along the cylindrical axis 202.

Figure 7C:
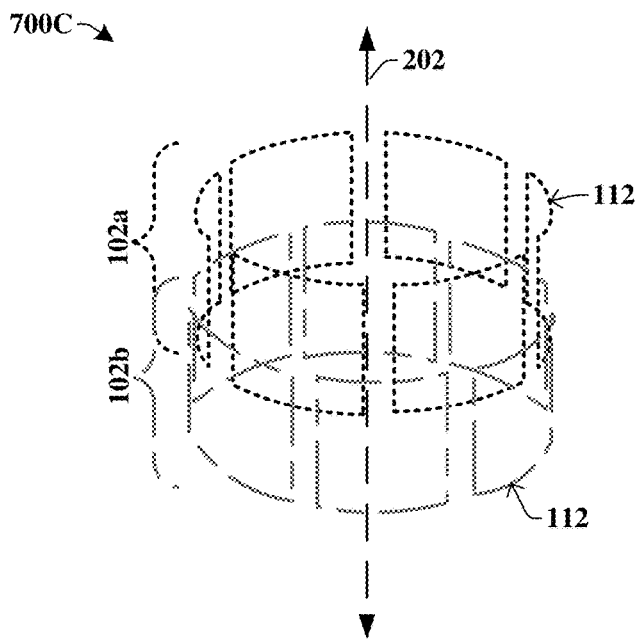

FIG. 7C illustrates a perspective view 700C of some alternative embodiments of the arrangement of the first row 102a of RF coil elements 112 and the second row 102b of the RF coil elements 112.

In some embodiments, the first row 102a is not completely spaced apart from the second row 102b. Thus, in some embodiments, lower portions of the RF coil elements 112 of the first row 102a overlap with upper portions of the RF coil elements 112. Further, in some embodiments, each RF coil element 112 of the first row 102a may overlap with two RF coil elements 112 of the second row 102b. Similarly, in some embodiments, each RF coil element 112 of the second row 102b may overlap with two RF coil elements 112 of the first row 102a. In other embodiments, more or less than two RF coil elements 112 of the first row 102a may overlap with each RF coil element 112 of the second row 102b depending on the design of the RF coil elements 112 in the first and second rows 102a, 102b. In some embodiments, although the first row 102a overlaps with the second row 102b, the RF coil elements 112 within the first row 102a are spaced apart from one another, and the RF coil elements 112 within the second row 102b are spaced apart from one another.

In some embodiments, the first row 102a partially overlaps with the second row 102b such that noise is reduced between direct neighboring RF coil elements 112 between the first and second rows 102a, 102b. In other words, in some embodiments, an RF coil element 112 within the first row 102a has direct neighboring RF coil elements 112 within the first row 102a and also has direct neighboring RF coil elements 112 within the second row 102b. For example, in some embodiments, an RF coil element 112 in the first row 102a may directly overlie two RF coil elements 112 in the second row 102b, wherein the two RF coil elements 112 in the second row 102b are direct neighbor RF elements with the RF coil element 112 in the first row 102a. Thus, in some embodiments, the overlapping between the first row 102a and the second row 102b may improve the SNR of each RF coil element 112 in the first and second rows 102a, 102b by reducing the noise at least between direct neighboring RF coil elements.

Figure 7D:
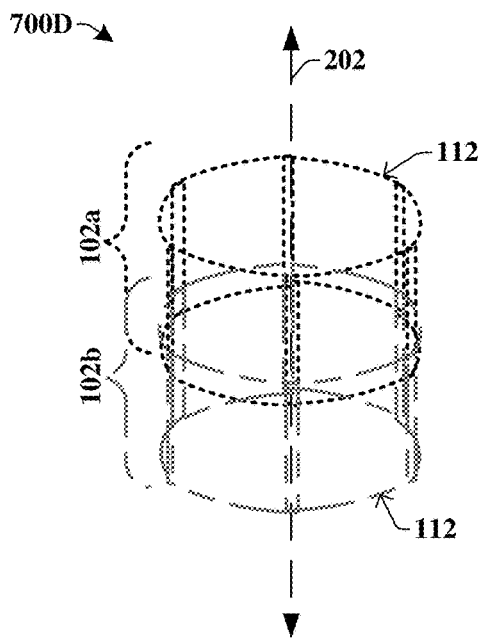

FIG. 7D illustrates a perspective view 700D of some other alternative embodiments of the arrangement of the first row 102a of RF coil elements 112 and the second row 102b of the RF coil elements 112.

In some embodiments, the RF coil elements 112 within the first row 102a overlap with one another around the cylindrical axis 202; the RF coil elements 112 within the second row 102b overlap with one another around the cylindrical axis 202; and the first row 102a of RF coil elements 112 overlap with the second row 102b of RF coil elements 112 along the cylindrical axis 202. Thus, in some embodiments, overlapping of RF coil elements 112 within a same row (e.g., 102a or 102b) as well as overlapping of RF coil elements 112 of two different rows (e.g., 102a and 102b) may be used to further improve the SNR of each RF coil elements in a first and second row 102a, 102b by reducing the noise between direct neighboring RF coil elements.

Figure 8A:
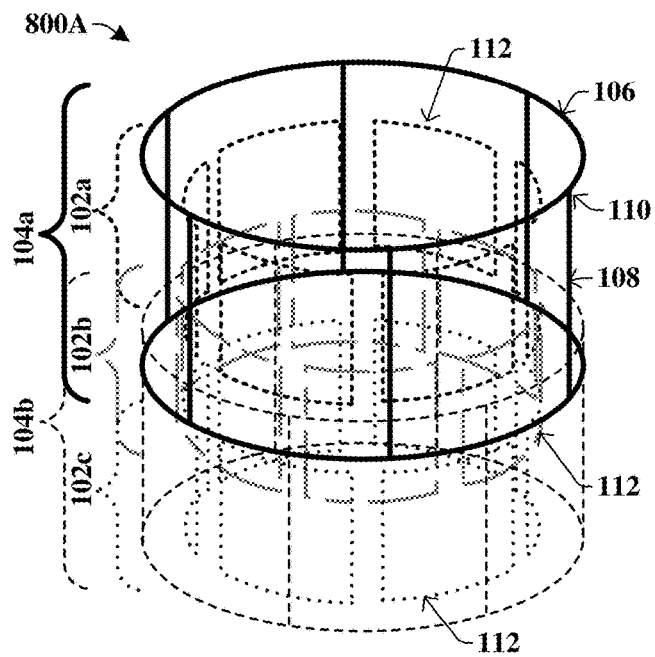
FIGS. 8A-8D illustrate various perspective views of some embodiments of a MRI RF coil array comprising two birdcage coils surrounding three rows of circumferentially arranged RF coil elements.

FIG. 8A illustrates a perspective view 800A of some embodiments of an MRI RF coil array comprising two birdcage coils surrounding three rows of RF coil elements.

The perspective view 800A of FIG. 8A includes a first row 102a of RF coil elements 112, a second row 102b of RF coil elements 112, and a third row 102c of RF coil elements 112. In some embodiments, the first, second, and third rows 102a, 102b, 102c circumferentially surround the cylindrical axis. The RF coil elements 112 of each of the first row 102a, the second row 102b, and the third row 102c are illustrated with a different line style for ease of understanding and differentiating between the first, second, and third rows 102a, 102b, 102c. In some embodiments, the RF coil elements 112 of the first, second, and third rows 102a, 102b, 102c comprise a same structure. In other embodiments, the RF coil elements 112 of the first, second, and/or third rows 102a, 102b, 102c may comprise different structures.

In some embodiments, the first, second, and third rows 102a, 102b, 102c are offset from one another along the cylindrical axis. In some embodiments, the second row 102b is arranged between the first and third rows 102a, 102c. In some embodiments, the coupling between RF coil elements 112 of direct neighboring rows (e.g., the first and second rows 102a, 102b and the second and third rows 102b, 102c) is strong without the presence of a birdcage coil (e.g., 104a, 104b). However, in some embodiments, the coupling between RF coil elements 112 of non-direct neighboring rows (e.g., the first and third rows 102a, 102c) is low without the presence of a birdcage coil (e.g., 104a, 104b). If the non-direct neighboring RF coil elements 112 of first and third rows 102a, 102c couple to a same birdcage coil, then the coupling between RF coil elements 112 in the first and third rows 102a, 102c would increase. Therefore, when there are more than two rows of RF coil elements 112, more than one birdcage coil (e.g., 104a, 104b) may be used to achieve isolation.

Thus, the perspective view 800A of FIG. 8A includes a first birdcage coil 104a arranged circumferentially around the first row 102a of RF coil elements 112 and the second row 102b of RF coil elements 112. Further, the perspective view 800A of FIG. 8A includes a second birdcage coil 104b arranged circumferentially around the second row 102b of RF coil elements 112 and the third row 102c of RF coil elements 112. The first and second birdcage coils 104a, 104b reduce coupling amongst all or some (e.g., most) RF coil elements 112 in the rows (e.g., 102a, 102b, 102c). The first and second birdcage coils 104a, 104b are illustrated with a different line style in FIG. 8A for ease of understanding and differentiating between the first and second birdcage coils 104a, 104b. In some embodiments, the first birdcage coil 104a comprises a same structure as the second birdcage coil 104b. In some other embodiments, the first birdcage coil 104a comprises a different structure than the second birdcage coil 104b.

In some such embodiments, the first birdcage coil 104a is completely offset from the third row 102c of RF coil elements 112 along the cylindrical axis. Thus, the first birdcage coil 104a does not surround any portion of the third row 102c of RF coil elements 112 and is not or is negligibly coupled to the RF coil elements 112 of the third row 102c. In some such embodiments, the second birdcage coil 104b is completely offset from the first row 102a of RF coil elements 112 along the cylindrical axis. Thus, the second birdcage coil 104b does not surround any portion of the first row 102a of RF coil elements 112 and is not or is negligibly coupled with the RF elements of the first row 102a.

In some embodiments, to prevent the first birdcage coil 104a from creating noise by coupling with the second birdcage coil 104b, the first birdcage coil 104a partially overlaps with the second birdcage coil 104b along the cylindrical axis. The partial overlap between the first birdcage coil 104a and the second birdcage coil 104b also prevents the first row 102a from coupling with the third row 102c. In some embodiments, the first birdcage coil 104a fully surrounds the first row 102a of RF coil elements 112 and only partially surrounds the second row 102b of RF coil elements 112. In some embodiments, the second birdcage coil 104b fully surrounds the third row 102c of RF coil elements 112 and only partially surrounds the second row 102b of RF coil elements 112. Further, in some embodiments, because the first birdcage coil 104a partially overlaps with the second birdcage coil 104b, a portion of the second row 102b of RF coil elements 112 is surrounded by the first and second birdcage coils 104a, 104b. In some embodiments, the overlapping first and second birdcage coils 104a, 104b may be employed as a pTx coil. In at least such embodiments, the pTx coil may support 4 independent driving modes (e.g., channels).

More generally, when there are more than two rows (e.g., 102a, 102b, 102c) of RF coil elements 112, then there are (N−1) birdcage coils (e.g., 104a, 104b) needed to achieve optimal isolation between all RF coil elements 112, wherein N is the number of rows. N can be any integer that is greater than or equal to 2. Thus, in FIG. 8A, because there are three rows (e.g., 102a, 102b, 102c) of RF coil elements 112, then N equals 3 and there are 2 birdcage coils (e.g., 104a, 104b) for isolation amongst all or some of the RF coil elements 112 in all three rows (e.g., 102a, 102b, 102c). Further, each birdcage coil (e.g., 104a, 104b) is tuned to a resonant frequency that is different than the working frequency, and has an impedance set, set so the birdcage coils that the decoupling benefit provided by the birdcage coils (e.g., 104a, 104b) is greater than the noise addition from current flowing through the birdcage coils (e.g., 104a, 104b). The impedance may, for example, be set according to Eq. 10 or variations thereof.

Figure 8B:
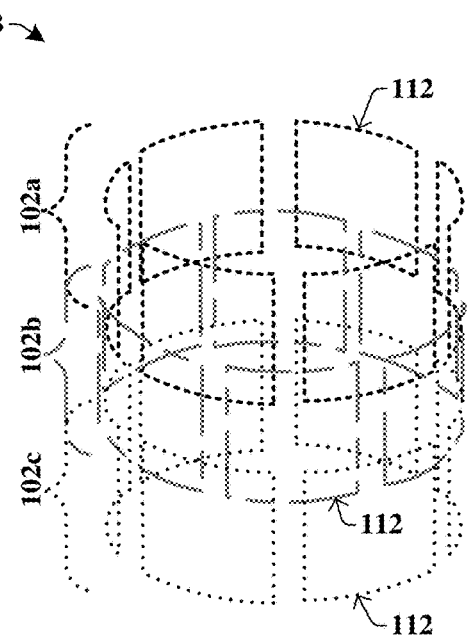

FIG. 8B illustrates a perspective view 800B some embodiments of FIG. 8A without the first and second birdcage coils 104a, 104b for ease of understanding of how the first, second, and third rows 102a, 102b, 102c are arranged around the cylindrical axis in some embodiments.

In some embodiments, the first row 102a partially overlaps with the second row 102b to reduce coupling between direct neighboring RF coil elements 112 in the first and second rows 102a, 102b. Similarly, in some embodiments, the third row 102c partially overlaps with the second row 102b to reduce coupling between direct neighboring RF coil elements 112 in the second and third rows 102b, 102c. In some embodiments, the RF coil elements 112 within a same row (e.g., the first row 102a, the second row 102b, or the third row 102c) are spaced apart from one another. In some other embodiments (not shown), the RF coil elements 112 within a same row (e.g., the first row 102a, the second row 102b, or the third row 102c) partially overlap with one another around the cylindrical axis to reduce coupling between non-direct neighboring RF coil elements 112 within a same row (e.g., the first row 102a, the second row 102b, or the third row 102c). In some embodiments, each row (e.g., the first row 102a, the second row 102b, the third row 102c) has a same number of RF coil elements 112. In other embodiments, some rows (e.g., the first row 102a, the second row 102b, or the third row 102c) may have a different number of RF coil elements 112 than other rows (e.g., the first row 102a, the second row 102b, or the third row 102c).

Further, in some other embodiments, some rows (e.g., the first row 102a, the second row 102b, and/or the third row 102c) may have overlapping RF coil elements 112 whereas other rows may have spaced apart RF coil elements 112. Further, in some other embodiments, some rows (e.g., the first row 102a, the second row 102b, and/or the third row 102c) may overlap with one another along the cylindrical axis, whereas other rows may be spaced apart from one another along the cylindrical axis.

Figure 8C:
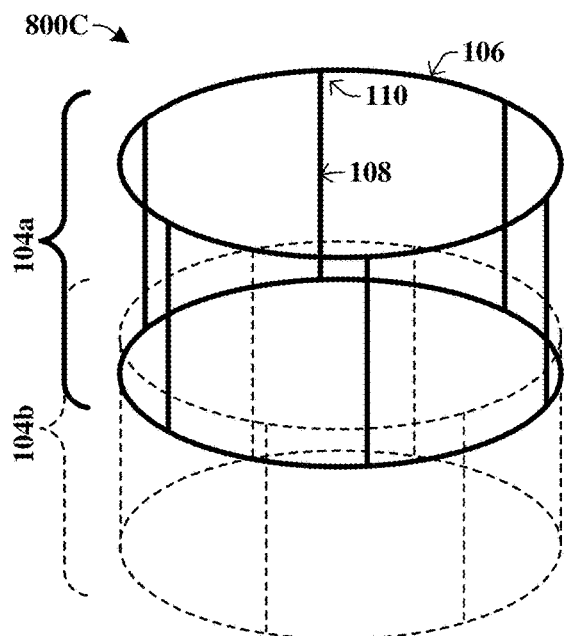

FIG. 8C illustrates a perspective view 800C of FIG. 8A without the first, second, and third rows 102a, 102b, 102c for ease of understanding of how the first and second birdcage coils 104a, 104b are arranged around the cylindrical axis in some embodiments.

In some embodiments, the first birdcage coil 104a has a first number of rungs 108, and the second birdcage coil 104b has a second number of rungs 108. In some embodiments, the first number of rungs 108 is equal to the second number of rungs 108. In some other embodiments, the first number of rungs 108 may be different than (e.g., less than or greater than) the second number of rungs 108. Further, in some embodiments, the first birdcage coil 104a may have the same or different dimensions than the second birdcage coil 104b. In some embodiments, the first birdcage coil 104a may have the same or different circuitry (not shown) than the second birdcage coil 104b. Further, in some embodiments, the rungs 108 of the first birdcage coil 104a may not directly overlap with the rungs 108 of the second birdcage coil 104b.

Figure 8D:
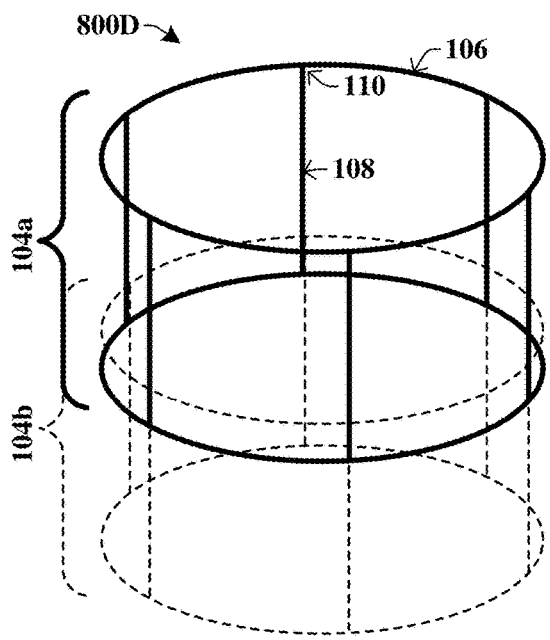

FIG. 8D illustrates a perspective view 800D of some other embodiments of how the first and second birdcage coils 104a, 104b are arranged around the cylindrical axis.

In some other embodiments, the rungs 108 of the first birdcage coil 104a may directly overlap with the rungs 108 of the second birdcage coil 104b. In other words, in some embodiments, the rungs 108 of the first birdcage coil 104a may be substantially co-linear with the rungs 108 of the second birdcage coil 104b. In some other embodiments, wherein the first number of rungs 108 of the first birdcage coil 104a is different than the second number of rungs 108 of the second birdcage coil 104b, some of the rungs 108 of the first and second birdcage coils 104a, 104b may be substantially co-linear with one another whereas other ones of the rungs 108 may not be co-linear with one another.

Figure 9:
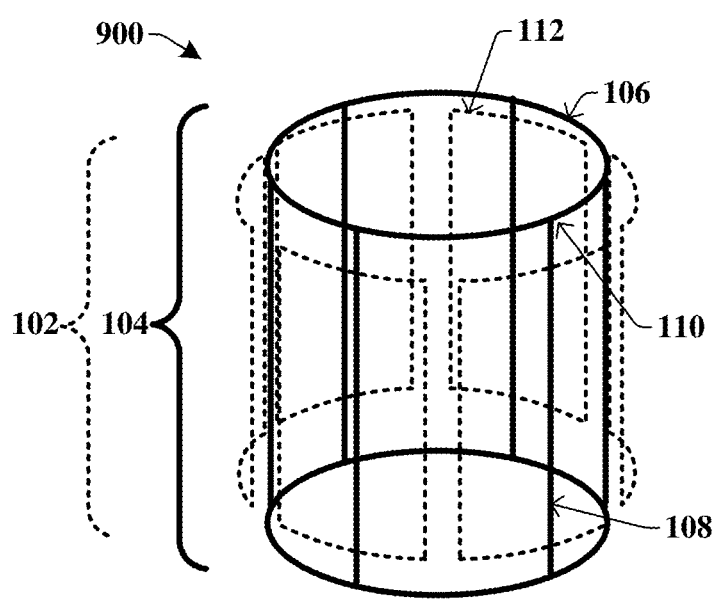
FIG. 9 illustrates a perspective view of some embodiments of a MRI RF coil array comprising a row of circumferentially arranged RF coil elements surrounding a birdcage coil.

FIG. 9 illustrates a perspective view 900 of some other embodiments wherein a birdcage coil is arranged inside of a row of RF coil elements to reduce noise amongst all RF coil elements.

In some embodiments, the birdcage coil 104 may be arranged inside the row 102 of RF coil elements 112 such that the birdcage coil 104 is arranged between the cylindrical axis and the row 102 of RF coil elements 112. In some applications, a body part is arranged along the cylindrical axis such that the body part is surrounded by the row 102 of RF coil elements 112 and the birdcage coil 104 to produce an image of the body part by MRI.

Figure 10:
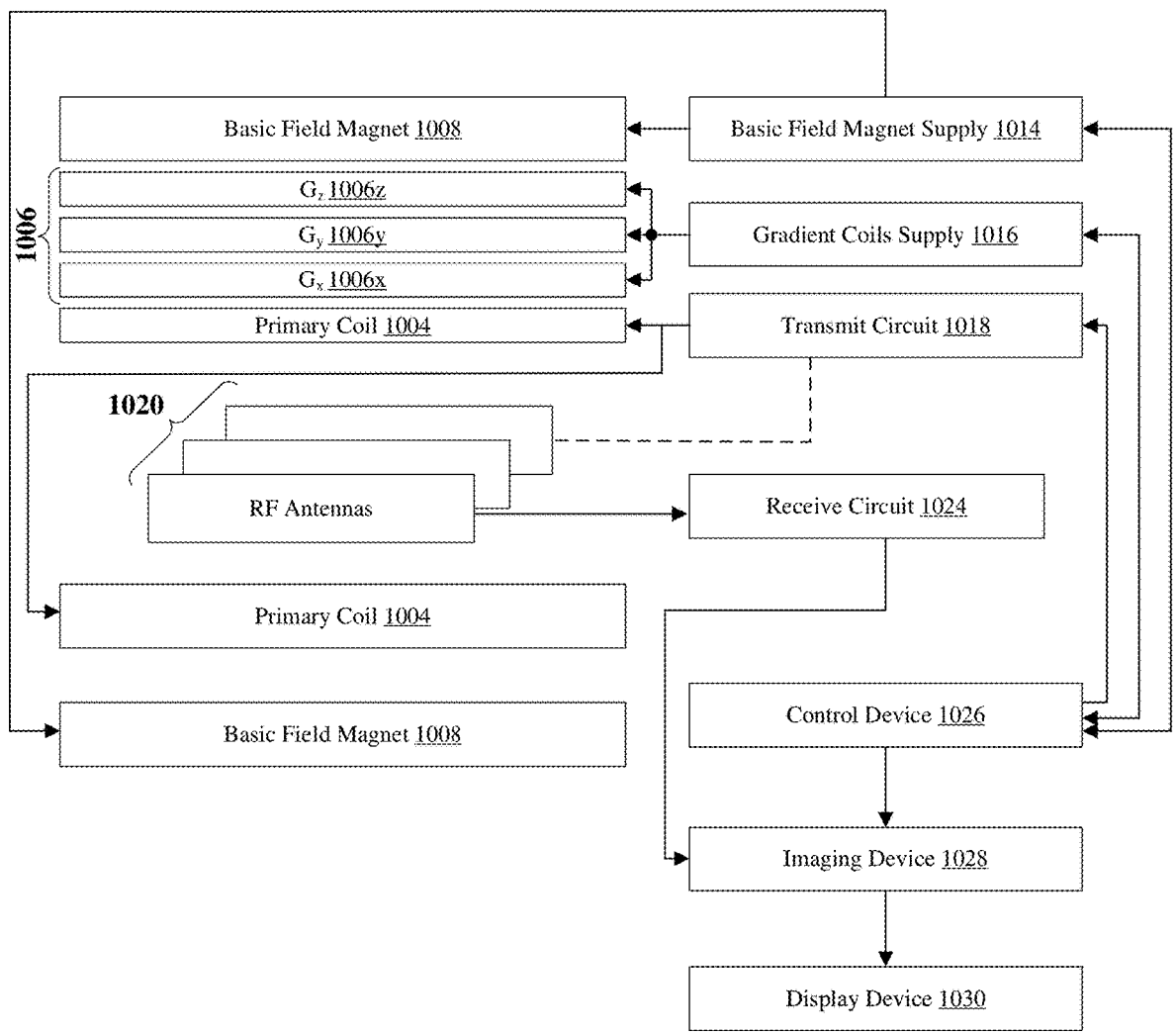
FIG. 10 illustrates a schematic of some embodiments of a MRI system.

FIG. 10 illustrates a schematic diagram of some embodiments of an MRI system 1000 that can be configured with, for example, MRI RF coils, coil channels, coil elements, coil arrays, or circuitry according to one or more embodiments described herein.

The MRI system 1000 of FIG. 10 includes basic field magnet(s) 1008 and a basic field magnet supply 1014. Ideally, the basic field magnets 1008 would produce a uniform B0 field. However, in practice, the B0 field may not be uniform, and may vary over an object being imaged by the MRI system 1000. In some embodiments, the MRI system 1000 includes gradient coils 1006 configured to emit gradient magnetic fields like Gx (e.g., via an associated gradient coil 1006), Gy (e.g., via an associated gradient coil 1006) and Gz (e.g., via an associated gradient coil 1006). The gradient coils 1006 can be controlled, at least in part, by a gradient coils supply 1016. In some examples, the timing, strength, and orientation of the gradient magnetic fields can be controlled, and thus selectively adapted during an MRI procedure.

In some embodiments, the MRI system 1000 includes a primary coil 1004 configured to generate RF pulses. In some embodiments, the primary coil 1004 is a whole body coil (WBC). In some embodiments, the primary coil 1004 comprises, for example, another birdcage coil. The primary coil 1004 can be controlled, at least in part, by a transmit circuit 1018, wherein the transmit circuit 1018 is configured to provide a signal to the primary coil 1004.

In some embodiments, the MRI system 1000 can include a set of RF antennas 1020 (e.g., one or more RF antennas). In some embodiments, the RF antennas 1020 can be configured to generate RF pulses and/or to receive resulting magnetic resonance signals from an object (e.g., a body part) to which the RF pulses are directed. A RF antenna 1020 configured solely to generate RF pulses can be referred to herein as a Tx antenna (or coil or coil array). A RF antenna 1020 configured solely to receive resulting magnetic resonance signals from an object to which the RF pulses are directed can be referred to herein as a Rx antenna (or coil or coil array). A RF antenna 1020 configured to both generate RF pulses and receive resulting magnetic resonance signals can be referred to herein as a Tx/Rx antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 1020 can be configured to inductively couple with primary coil 1004 and generate RF pulses and to receive resulting magnetic resonance signals from an object to which the RF pulses are directed. In other words, the RF antennas 1020 may be wirelessly coupled to a power source (e.g., a transmit circuit 1018) by inductive coupling with the primary coil 1004. In other embodiments, RF antennas 1020 can be wired to a power source (e.g., the transmit circuit 1018) that can drive RF antennas 1020 to generate RF pulses, and RF antennas 1020 can also be configured to receive resulting magnetic resonance signals from an object to which the RF pulses are directed. In one embodiment, one or more members of the set of RF antennas 1020 can be fabricated from flexible coaxial cable, or other conductive material. The set of RF antennas 1020 can be connected with a receive circuit 1024. In various embodiments, the set of RF antennas 1020 can include various combinations of example embodiments of MRI RF coil arrays, elements or example embodiments of MRF RF coil arrays according to various embodiments described in FIGS. 1-3, 6A, 7A, 8A, and 9, for example.

The gradient coils supply 1016 and the transmit circuit 1018 can be controlled, at least in part, by a control device 1026. The magnetic resonance signals received from the set of RF antennas 1020 can be employed to generate an image, and thus can be subject to a transformation process like a two dimensional fast Fourier transform (FFT) that generates pixelated image data. The transformation can be performed by an imaging device 1028 or other similar processing device. The image data can then be shown on a display device 1030. In some embodiments, the receive circuit 1024 is connected the control device 1026 or the image device 1028.

In some embodiments, the control device 1026 can control the transmit circuit 1018 to directly drive the primary coil 1004 with a current, voltage, or a control signal. Further, the primary coil 1004 can be inductively coupled with an MRI RF coil array, such that the MRI RF coil array is driven indirectly via the primary coil 1004. In some embodiments, the control device 1026 can control the transmit circuit 1018 to drive the MRI RF coil array directly. The MRI RF coil array in either of these embodiments may, for example, be as in any of FIGS. 1-3, 6A, 7A, 8A, and 9, for example. In some embodiments, each element of the RF antennas 1020 may be individually controllable by the control device 1026. In some embodiments, the birdcage coil (e.g., 104) of the MRI RF coil array may correspond to one of the RF antennas and may be directly wired to a RF power amplifier or wired connected to the RF power amplifier inductively through the WBC (e.g., primary coil 1004). The control device 1026 can provide a DC bias current or control a DC bias control circuit to control the application of a DC bias current to the MRI RF coil arrays as described in this specification or other elements of the RF antennas 1020. For example, the DC bias may bias the PIN diodes 506 at FIG. 5.

While FIG. 10 illustrates an example MRI system 1000 that includes various components connected in various ways, it is to be appreciated that other MRI systems can include other components connected in other ways, and can be employed in connection with various embodiments discussed in this specification.

Figure 11:
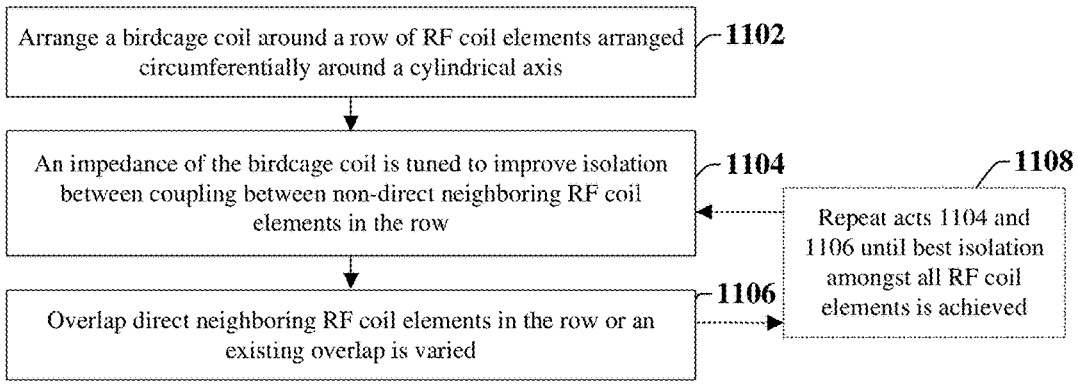
FIG. 11 illustrates a flow diagram of some embodiments of a method of arranging and controlling a birdcage coil surrounding a row of circumferentially arranged RF coil elements to isolate the RF coil elements.

FIG. 11 illustrates a flow diagram of some embodiments of a method 1100 of arranging and controlling a birdcage coil surrounding a row of circumferentially arranged RF coil elements to isolate the RF coil elements. The birdcage coil and the row of RF coil elements described in the method 1100 of FIG. 11 may correspond to the embodiments discussed in FIGS. 1-3 and FIGS. 6A-6C, 7A-7D, and 8A-8D, for example.

While the method 1100 of FIG. 11 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1102, a birdcage coil is arranged around a row of RF coil elements arranged circumferentially around a cylindrical axis. FIG. 1 illustrates a perspective view 100 of some embodiments corresponding to act 1102.

At act 1104, an impedance of the birdcage coil is tuned to improve isolation between non-direct neighboring RF coil elements in the row. For example, the impedance may be tuned to an impedance determined according to Eq. 10. Tuning the impedance has the effect of tuning the resonant frequency of the birdcage coil and vice versa.

At act 1106, direct neighboring RF coil elements in the row are overlapped or an existing overlap is otherwise varied. FIG. 6A illustrates a perspective view 600A of some embodiments corresponding to act 1106.

At act 1108, acts 1104 and 1106 are repeated several times until a best isolation amongst all RF coil elements is achieved. Acts 1104 and 1106 may be repeated 2, 5, 10, 20, 50, 100, or more times.

Figure 12:
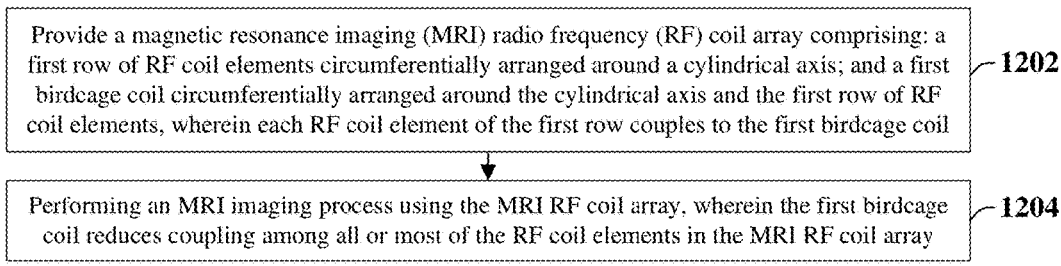
FIG. 12 illustrates a flow diagram of some embodiments of a method of conducting an MRI process using a MRI RF coil array comprising a birdcage coil surrounding a row of circumferentially arranged RF coil elements.

FIG. 12 illustrates a flow diagram of some embodiments of a method 1200 of conducting an MRI process using a MRI RF coil array comprising a birdcage coil surrounding a row of circumferentially arranged RF coil elements.

While the method 1200 of FIG. 12 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1202, an MRI RF coil array is provided and comprises a first row of RF coil elements circumferentially arranged around a cylindrical axis and a first birdcage coil circumferentially arranged around the cylindrical axis and the first row of RF coil elements. Each RF coil element of the first row couples to the first birdcage coil. FIG. 1 illustrates a perspective view 100 of some embodiments corresponding to act 1202.

At act 1204, an MRI imaging process using the MRI RF coil array is performed. During the MRI imaging process, the first birdcage coil reduces coupling among all or some (e.g., most) of the RF coil elements in the MRI RF coil array. For example, the RF coil elements may be employed for receiving MR signals and the first birdcage coil may provide decoupling amongst the RF coil elements during the receiving. Further, the birdcage coil may transmit RF energy to excite nuclei in a scan target to generate the MR signals while the RF coil elements are disabled and/or detuned.

Figure 13:
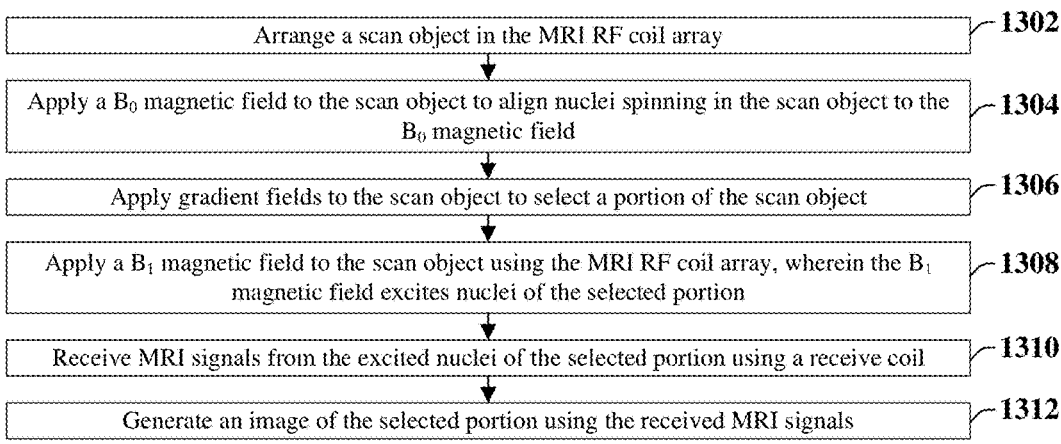
FIG. 13 illustrates a flow diagram of some embodiments of a method of conducting an MRI process more generally.

FIG. 13 illustrates a flow diagram of some embodiments of a method 1300 of conducting an MRI process more generally. The method 1300 may be best understood when referring to the exemplary MRI system 1000 of FIG. 10.

While the method 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1302, a scan object is arranged in the MRI RF coil array.

At act 1304, a B0 magnetic field is applied to scan the object to align nuclei spinning in the scan object to the B0 magnetic field.

At act 1306, gradient fields are applied to the scan object to select a portion of the scan object.

At act 1308, a B1 magnetic field is applied to the scan object using the MRI RF coil array, wherein the B1 magnetic field excites nuclei of the selected portion. The B1 magnetic field may be generated by a birdcage coil of the MRI RF coil array or by RF coil elements of the RF coil array.

At act 1310, MRI signals from the excited nuclei of the selected portion are received using a receive coil. For example, the RF coil elements may serve as a phased array receive coil while the birdcage coil provides decoupling amongst the RF coil elements.

At act 1312, an image of the selected portion is generated using the received MRI signals.

Therefore, the present disclosure provides a MRI RF coil array configuration with a birdcage coil surrounding a row of circumferentially arranged RF coil elements to reduce coupling amongst RF coil elements, thereby improving the SNR of the MRI RF coil array and improving the quality of the image produced by an MRI imaging process.

Accordingly, in some embodiments, the present disclosure relates to a magnetic resonance imaging (MRI) radio frequency (RF) coil array configured to operate in at least one of a transmit (Tx) mode or a receive (Rx) mode on a cylindrical former, the MRI RF coil array comprising: a first row of RF coil elements comprising at least three RF coil elements that circumferentially surround an axis; and a first birdcage coil that circumferentially surrounds the first row of RF coil elements, wherein each RF coil element of the first row is configured to inductively couple to the first birdcage coil and to each other RF coil element, and wherein the first birdcage coil has an impedance configured to negate inductive coupling between the RF coil elements of the first row.

In other embodiments, a magnetic resonance imaging (MRI) radio frequency (RF) coil array comprising: a first row of RF coil elements circumferentially arranged around an axis, wherein the first row comprises a first RF coil element and a second RF coil element; and a first birdcage coil circumferentially arranged around the axis, wherein the first row of RF coil elements is between the first birdcage coil and the axis, wherein each RF coil element of the first row is inductively coupled to the first birdcage coil, and wherein a resonant frequency of the first birdcage coil is configured to negate noise between the RF coil elements of the first row.

In yet other embodiments, the present disclosure relates to a method comprising: providing a magnetic resonance imaging (MRI) radio frequency (RF) coil array comprising: a first row of RF coil elements, wherein the first row comprises at least three RF coil elements circumferentially arranged around an axis; and a first birdcage coil circumferentially arranged around the axis, wherein the first row of RF coil elements is between the first birdcage coil and the axis, and wherein each RF coil element of the first row inductively couples to the first birdcage coil and to each other RF coil element of the first row; and performing an MRI imaging process on a scan target using the MRI RF coil array, wherein the first birdcage coil negates inductive coupling between the RF coil elements.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A magnetic resonance imaging (MRI) radio frequency (RF) coil array configured to operate in at least one of a transmit (Tx) mode or a receive (Rx) mode on a cylindrical former, the MRI RF coil array comprising:
a first row of RF coil elements comprising at least three RF coil elements that circumferentially surround an axis; and
a first birdcage coil that circumferentially surrounds the first row of RF coil elements,
wherein each RF coil element of the first row is configured to inductively couple to the first birdcage coil and to each other RF coil element, and
wherein the first birdcage coil has an impedance configured to negate inductive coupling between the RF coil elements of the first row.

2. The MRI RF coil array of claim 1, wherein the first birdcage coil has a resonant frequency different than a working frequency of the MRI RF coil array.

3. The MRI RF coil array of claim 1, wherein each RF coil element of the first row at least partially overlaps with each direct neighboring RF coil element in the first row.

4. The MRI RF coil array of claim 1, further comprising:
a second birdcage coil;
a second row of RF coil elements comprising at least three RF coil elements that circumferentially surround the axis; and
a third row of RF coil elements comprising at least three RF coil elements that circumferentially surround the axis,
wherein the second row is between the first row and the third row along the axis, wherein the first birdcage coil fully surrounds the first row and partially surrounds the second row, wherein the second birdcage coil fully surrounds the third row and partially surrounds the second row, and wherein the first birdcage coil partially overlaps with the second birdcage coil along the axis.

5. The MRI RF coil array of claim 4, wherein the second row partially overlaps with the first row and the third row along the axis.

6. The MRI RF coil array of claim 1, further comprising:
a second row of RF coil elements comprising at least three RF coil elements that circumferentially surround the axis,
wherein the first row is longitudinally offset from the second row along the axis.

7. The MRI RF coil array of claim 6, wherein the first birdcage coil circumferentially surrounds the first row and the second row, and wherein the impedance is configured to negate inductive coupling between the RF coil elements of the first and second rows.

8. The MRI RF coil array of claim 6, wherein each RF coil element of the first row at least partially overlaps with each direct neighboring RF coil element in the second row for decoupling.

9. The MRI RF coil array of claim 1, wherein the impedance has an opposite sign as mutual inductance between two RF coil elements in the first row.

10. A magnetic resonance imaging (MRI) radio frequency (RF) coil array comprising:
a first row of RF coil elements circumferentially arranged around an axis, wherein the first row comprises a first RF coil element and a second RF coil element; and
a first birdcage coil circumferentially arranged around the axis,
wherein the first row of RF coil elements is between the first birdcage coil and the axis,
wherein each RF coil element of the first row is inductively coupled to the first birdcage coil, and
wherein a resonant frequency of the first birdcage coil is configured to negate noise between the RF coil elements of the first row.

11. The MRI RF coil array of claim 10, wherein the first RF coil element has a plurality of mutual inductances respectively with other RF coil elements of the first row, and wherein an impedance of the RF coil element is inversely proportional to an average of the mutual inductances.

12. The MRI RF coil array of claim 10, wherein each RF coil element of the first row partially overlaps each direct neighboring RF coil element in the first row.

13. The MRI RF coil array of claim 10, wherein the first RF coil element and the second RF coil element comprise individual preamplifiers configured to reduce inductive coupling between the first and second RF coil elements.

14. The MRI RF coil array of claim 10, wherein the first birdcage coil comprises:
a first end ring and a second end ring, wherein the first end ring comprises a capacitor;
a plurality of rungs interconnecting the first and second end rings and spaced circumferentially around the axis; and
a circuit leg comprising a PIN diode and a reactive element electrically coupled in series, wherein the circuit leg is electrically coupled in parallel with the capacitor, and wherein the reactive element is a capacitor or an inductor,
wherein the PIN diode is configured to electrically couple the reactive element in parallel with the capacitor in response to a transmit mode of the MRI RF coil array and to remove the reactive element from in parallel with the capacitor in response to a receive mode of the MRI RF coil array.

15. A method comprising:
providing a magnetic resonance imaging (MRI) radio frequency (RF) coil array comprising: a first row of RF coil elements, wherein the first row comprises at least three RF coil elements circumferentially arranged around an axis; and a first birdcage coil circumferentially arranged around the axis, wherein the first row of RF coil elements is between the first birdcage coil and the axis, and wherein each RF coil element of the first row inductively couples to the first birdcage coil and to each other RF coil element of the first row; and
performing an MRI imaging process on a scan target using the MRI RF coil array, wherein the first birdcage coil negates inductive coupling between the RF coil elements.

16. The method according to claim 15, wherein the performing of the MRI imaging process comprises:

transmitting RF energy into the scan target with the first birdcage coil, wherein the RF energy is transmitted at a working frequency.

17. The method according to claim 16, wherein the transmitting comprises changing a resonant frequency of the first birdcage coil from a decoupling frequency to the working frequency, wherein the decoupling and working frequencies are different.

18. The method according to claim 15, wherein the performing of the MRI imaging process comprises:

receiving MRI signals at a working frequency from the scan target using the RF coil elements, wherein the first birdcage coil negates the inductive coupling between the RF coil elements, and has a resonant frequency different than the working frequency, during the receiving.

19. The method according to claim 15, wherein the at least three RF coil elements comprises a first RF coil element, wherein the first RF coil element has a first mutual inductance with the first birdcage coil, wherein the first RF coil element has a plurality of second mutual inductances respectively with other RF coil elements of the first row, and wherein the first birdcage coil has an impedance that is proportional to a ratio of the first mutual inductance squared to an average of the second mutual inductances to negate the inductive coupling.

20. The method according to claim 15, wherein the at least three RF coil elements comprises a first RF coil element and a second RF coil element, wherein the first RF coil element has a first mutual inductance with the first birdcage coil, wherein the first RF coil element has a second mutual inductance with the first RF coil element, and wherein the first and second mutual inductances have opposite signs.

* * * * *